(12) United States Patent
Takagi

(10) Patent No.: US 7,554,417 B2
(45) Date of Patent: Jun. 30, 2009

(54) CIRCUIT AND METHOD FOR ADJUSTING IMPEDANCE

(75) Inventor: Takuya Takagi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/042,445

(22) Filed: Mar. 5, 2008

(65) Prior Publication Data
US 2008/0218287 A1 Sep. 11, 2008

(30) Foreign Application Priority Data
Mar. 5, 2007 (JP) ............................ 2007-053945

(51) Int. Cl.
H03H 11/28 (2006.01)
(52) U.S. Cl. ........................ 333/17.3; 333/32
(58) Field of Classification Search ............. 333/17.3, 333/32, 33
See application file for complete search history.

(56) References Cited
FOREIGN PATENT DOCUMENTS
JP 2005229177 A 8/2005

Primary Examiner—Stephen E Jones

(57) ABSTRACT

An impedance adjusting circuit includes a semiconductor device accommodated in a semiconductor device case which has case pins and having a folded conductive line; an external reference resistor connected between a positive power supply line and a first one of the case pins, wherein a first line between the first case pin and the semiconductor device has a specific resistance; a first reference voltage generation resistor connected between the power supply line and a second one of the case pins; a second reference voltage generation resistor connected between the ground and a third one of the case pins; a resistance circuit comprising a second line between the second case pin and the folded conductive line and a third line between the third case pin and the folded conductive line, wherein a resistance between the second case pin and the third case pin is equal to the specific resistance; and a fourth line connected from the semiconductor device to the ground through the second reference voltage generation resistor and having a resistance equal to the specific resistance. The semiconductor device includes an adjusting circuit having a buffer and configured to adjust an output impedance of the buffer to be adaptive for a predetermined impedance.

16 Claims, 7 Drawing Sheets

CIRCUIT AND METHOD FOR ADJUSTING IMPEDANCE

This patent application is based on Japanese Patent application No. 2007-053945 filed on Mar. 5, 2007. The disclosure thereof is incorporated herein by reference.

TECHNICAL FIELD

The present invention relates to an impedance adjusting circuit and an impedance adjusting method, and more particularly relates to an impedance adjusting circuit and an impedance adjusting method, in which an impedance of an output buffer is adjusted.

BACKGROUND ART

In association with a higher-speed operation of a semiconductor device, a high-speed signal transmission is carried out between various information processing apparatuses using the semiconductor devices. In the transmission, reflection of a signal occurs in a portion in which impedance is discontinuous. This signal reflection causes a problem in association with the advancement of the high-speed signal transmission. The impedance of a transmission line has a fixed value. On the contrary, the impedance of an output buffer varies depending on various situations such as a process, a temperature and a voltage. Accordingly, unless the impedance of the output buffer is properly adjusted to the impedance of the transmission line, it is impossible to carry out the high-speed signal transmission.

For this reason, an impedance matching is proposed in which an impedance adjustment output buffer is connected to an external clamp circuit that is set to be matched to the impedance of the transmission line, as described in Japanese Patent Application Publication (JP-P2005-229177A).

FIG. 1 is a circuit diagram showing the configuration of an impedance adjusting circuit in a related art. An impedance adjusting output buffer 103 is arranged in an LSI 102 as a semiconductor device accommodated in an LSI (Large Scale Integration) case 101 or PWB (Printed Wiring Board) in an impedance adjusting circuit 100. A variable resistor 104 is built in the impedance adjusting output buffer 103 and is attained through on/off operations of a plurality of transistors (not shown). A control circuit 105 controls the resistance of this variable resistor 104. The impedance adjusting output buffer 103 is connected to a clamp resistor 106 outside the LSI case 101. This clamp resistor 106 is a reference resistor, when the impedance is adjusted by the impedance adjusting output buffer 103. A line between the impedance adjusting output buffer 103 and the clamp resistor 106 has a predetermined parasitic resistance component 107. Outside the LSI case 101, in addition to the clamp resistor 106, there are arranged a first reference voltage generation resistor 111 and a second reference voltage generation resistor 112 which are connected in series between a power supply line 108 and the ground. A connection node between the first reference voltage generation resistor 111 and the second reference voltage generation resistor 112 is connected to a comparator 114 through a predetermined parasitic resistance component 113 and a voltage of the connection node is compared with a voltage at the output of the impedance adjusting output buffer 103. The control circuit 105 carries out the impedance matching by controlling the resistance of the variable resistor 104 based on the comparison result of the comparator 114.

Here, it is supposed that the parasitic resistance components 107 and 113 can be ignored. In this case, the control circuit 105 controls the resistance of the variable resistor 104 so that the voltage applied to a positive input terminal of the comparator 114 and the voltage applied to a negative input terminal thereof become equal. When the voltages applied to the these two input terminals of the comparator 114 become equal, the impedance matching on the side of the impedance adjusting output buffer 103 is assumed to be attained.

However, in the impedance adjusting circuit 100 in this related art, there is a line between the clamp resistor 106 outside the LSI case 101 and the LSI 102 in the LSI case 101. Since the connection node between the first reference voltage generation resistor 111 and the second reference voltage generation resistor 112 similarly exists outside the LSI case 101, a line exist between the connection node and the LSI 102. Since these lines have parasitic resistance components 107 and 113, the voltage differences are generated due to those portions. For this reason, at the two input terminals of the comparator 114, it is impossible to accurately compare a voltage resulting from the clamp resistor 106 and a voltage at the connection node between the first reference voltage generation resistor 111 and the second reference voltage generation resistor 112. As a result, an error is generated in the resistance of the variable resistor 104 controlled by the control circuit 105. Consequently, the compensation of the impedance adjusting output buffer 103 is imperfectly executed, and the impedance matching cannot be carried out in a sufficient precision.

Conventionally, a proposal is given in which a resistor having a resistance corresponding to the parasitic resistance component is added to the circuit to compensate the error. Consequently, it is possible to improve the precision of the impedance matching. However, the resistor to be added to outside is based on [E Series] serving as the standard number that a value between [1] and [10] is divided by a geometric series. For example, in the E12 series, the range is divided by 12, and in the E14 series, the range is divided by 24. Thus, when a small resistance such as the parasitic resistance is compensated outside the LSI case 101, any one of the resistance values in those series is selected and employed. Thus, it is impossible to sufficiently compensate the error.

The proposal shown in FIG. 1 is designed in such a manner that the resistance of the adjusting circuit is N (N is any integer) times the resistance of the circuit to be adjusted, and the error is reduced to 1/N, to reduce the compensation error. However, as mentioned above, since the improvement of the operation speed of the impedance adjusting circuit is remarkable, a higher precision of the impedance matching is required. Thus, it is difficult to adjust the impedance on the semiconductor device side in a sufficient precision by using the related art.

SUMMARY

It is therefore an object of the present invention to provide an impedance adjusting circuit and an impedance adjusting method, which a parasitic resistance component of a line between a semiconductor device and an external resistor can be compensated without a special circuit.

In an exemplary aspect of the present invention, an impedance adjusting circuit includes a semiconductor device accommodated in a semiconductor device case which has case pins and having a folded conductive line; an external reference resistor connected between a positive power supply line and a first one of the case pins, wherein a first line between the first case pin and the semiconductor device has a specific resistance; a first reference voltage generation resistor connected between the power supply line and a second one of the case pins; a second reference voltage generation resistor connected between the ground and a third one of the case pins; a resistance circuit comprising a second line between the second case pin and the folded conductive line and a third line between the third case pin and the folded conductive line, wherein a resistance between the second case pin and the third case pin is equal to the specific resistance; and a fourth line connected from the semiconductor device to the ground through the second reference voltage generation resistor and having a resistance equal to the specific resistance. The semiconductor device includes an adjusting circuit having a buffer and configured to adjust an output impedance of the buffer to be adaptive for a predetermined impedance.

In another exemplary aspect of the present invention, an impedance adjusting method includes providing an impedance adjusting circuit which includes a semiconductor device accommodated in a semiconductor device case which has case pins and having a folded conductive line, an external reference resistor connected between a positive power supply line and a first one of the case pins, wherein a first line between the first case pin and the semiconductor device has a specific resistance, a first reference voltage generation resistor connected between the power supply line and a second one of the case pins, a second reference voltage generation resistor connected between the ground and a third one of the case pins, a resistance circuit comprising a second line between the second case pin and the folded conductive line and a third line between the third case pin and the folded conductive line, wherein a resistance between the second case pin and the third case pin is equal to the specific resistance, and a fourth line connected from the semiconductor device to the ground through the second reference voltage generation resistor and having a resistance equal to the specific resistance. The impedance adjusting method adjusting an output impedance of a buffer to be adaptive for a predetermined impedance.

BRIEF DESCRIPTION OF THE DRAWINGS

The above and other objects, advantages and features of the present invention will be more apparent from the following description of certain exemplary embodiments taken in conjunction with the accompanying drawings, in which.

EXEMPLARY EMBODIMENTS

Hereinafter, an impedance adjusting circuit for a semiconductor device according to exemplary embodiments of the present invention will be described in detail with reference to the attached drawings.

Figure 2:
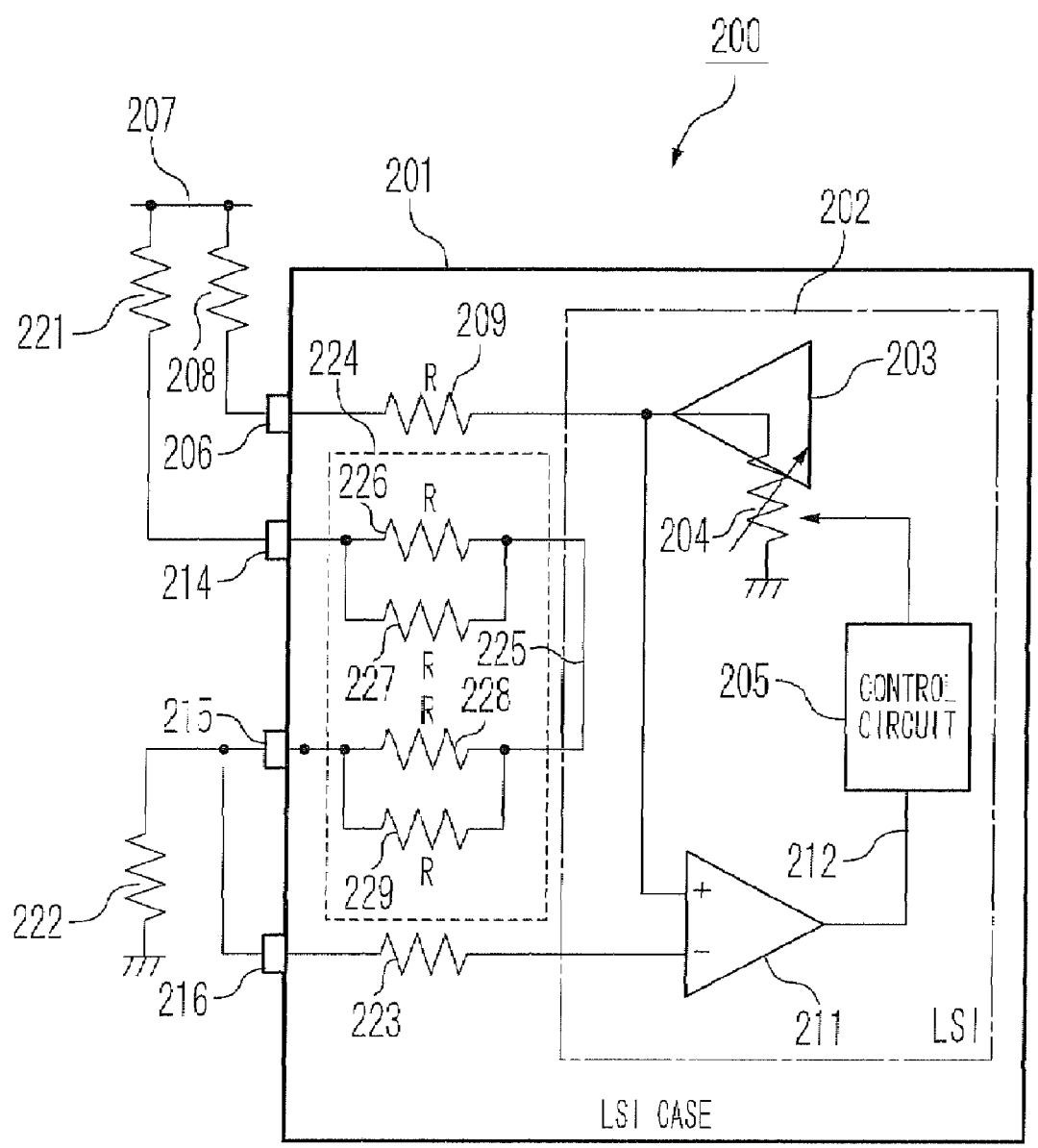
FIG. 2 is a circuit diagram showing a configuration of an impedance adjusting circuit according to a first exemplary embodiment of the present invention.

FIG. 2 is a circuit diagram showing a configuration of the impedance adjusting circuit 200 according to a first exemplary embodiment of the present invention. In the impedance adjusting circuit 200 of the first exemplary embodiment, an impedance adjusting output buffer (replica buffer) 203 is arranged in an LSI 202 accommodated in an LSI case 201. A semiconductor device is formed from the LSI 202 and the LSI case 201. A variable resistor 204 that is realized through on/off operations of a plurality of field effect transistors (which will be described later) is built in the impedance adjusting output buffer 203, and the resistance value is controlled by a control circuit 205. The output of the impedance adjusting output buffer 203 is connected to a first case pin 206 of the LSI case 201. The first case pin 206 is connected to one end of a clamp resistor 208 which is arranged outside the LSI case 201. The other end of the clamp resistor 208 is connected to a common connection line 207. The line 207 may be a power supply line. The clamp resistor 208 functions as an external reference resistor used for impedance matching. A line between the output of the impedance adjusting output buffer 203 and the first case pin 206 has a parasitic resistance component 209. The output of the impedance adjusting output buffer 203 is also connected to a positive input side of a comparator 211. A comparison result 212 outputted from the output of the comparator 211 is supplied to the control circuit 205.

In the first exemplary embodiment, in addition to the first case pin 206 of the LSI case 201, second to fourth case pins 214 to 216 are provided and assigned for the impedance adjusting circuit 200. The first to fourth case pins 206 and 214 to 216 have no relation to actual pin numbers in the LSI case 201, and they may be arbitrarily assigned. A first reference voltage generation resistor 221 is connected between the power supply line 207 and the second case pin 214. A second reference voltage generation resistor 222 is connected between the ground and a common connection node between the third and fourth case pins 215 and 216. The negative input terminal of the comparator 211 is connected to the fourth case pin 216 by a line. The line has a parasitic resistance component 223.

In the first exemplary embodiment, a resistance circuit 224 is formed in the LSI case 201 and is connected between the second case pin 214 and the third case pin 215, which are originally short-circuited. A part of the resistance circuit 224 enters the LSI 202 and is returned to the outside of the LSI 202 through a folded conductive line of the LSI 202. The resistance circuit 224 includes a line having first and second resistor components 226 and 227 and connected between the second case pin 214 and the folded conductive line 225, and a line having third and fourth resistor components 228 and 229 and connected between the folded line 225 and the third case pin 215. The first to fourth resistance components 226 to 229 are not formed as resistors having collective constants, but are formed as parasitic resistance components. The first to fourth resistance components 226 to 229 are parasitic resistances generated by lines having a same width, thickness and length as two lines between the first case pin 206 and the fourth case pin 216 and the LSI 202. That is, two lines having a same width, thickness and length as the line between the fourth case pin 216 and the LSI 202 are formed in parallel between the second case pin 214 and the folded conductive line 225. Also, two lines having a same width, thickness and length as the line between the fourth case pin 216 and the LSI 202 are formed in parallel between the second case pin 215 and the folded conductive line 225.

In the impedance adjusting circuit 200 having the above-described configuration, it is supposed that the parasitic resistance component 209 of the line between the first case pin 206 and the LSI 202 is defined as a resistance R. In this case, the resistance values of the first to fourth resistance components 226 to 229 and the parasitic resistance component 223 have the resistance R. It is supposed that the parasitic resistance component between the second case pin 214 and the third case pin 215 are defined as $R_{P2P3}$, and a synthetic resistance of the resistance components 226 and 227 and a synthetic resistance between the resistance components 228 and 229 are defined as $R_{G1}$ and $R_{G2}$, respectively. In this case, the following equations (1) to (3) are met.

$$R_{P2P3} = R_{G1} + R_{G2} \quad (1)$$

$$1/R_{G1} = 1/R + 1/R \quad (2)$$

$$1/R_{G2} = 1/R + 1/R \quad (3)$$

Thus, from the equations (2) and (3), the following equation (4) is derived.

$$R_{G1} = R_{G2} = R/2 \quad (4)$$

When this result is substituted into the equation (1), the following equation (5) is obtained.

$$\begin{aligned} R_{P2P3} &= R/2 + R/2 \\ &= R \end{aligned} \quad (5)$$

That is, in the first exemplary embodiment, under the situation that the influence of the parasitic resistance components due to the LSI case 201 is cancelled, the comparator 211 compares a voltage at the first case pin 206 connected to the clamp resistor 208 and a voltage at the connection node between the first and second reference voltage generation resistors 221 and 222. The control circuit 205 receives the comparison result 212. Thus, any error caused due to the parasitic resistance components is never generated in an ideal condition under which the equation (5) is met.

Figure 3:
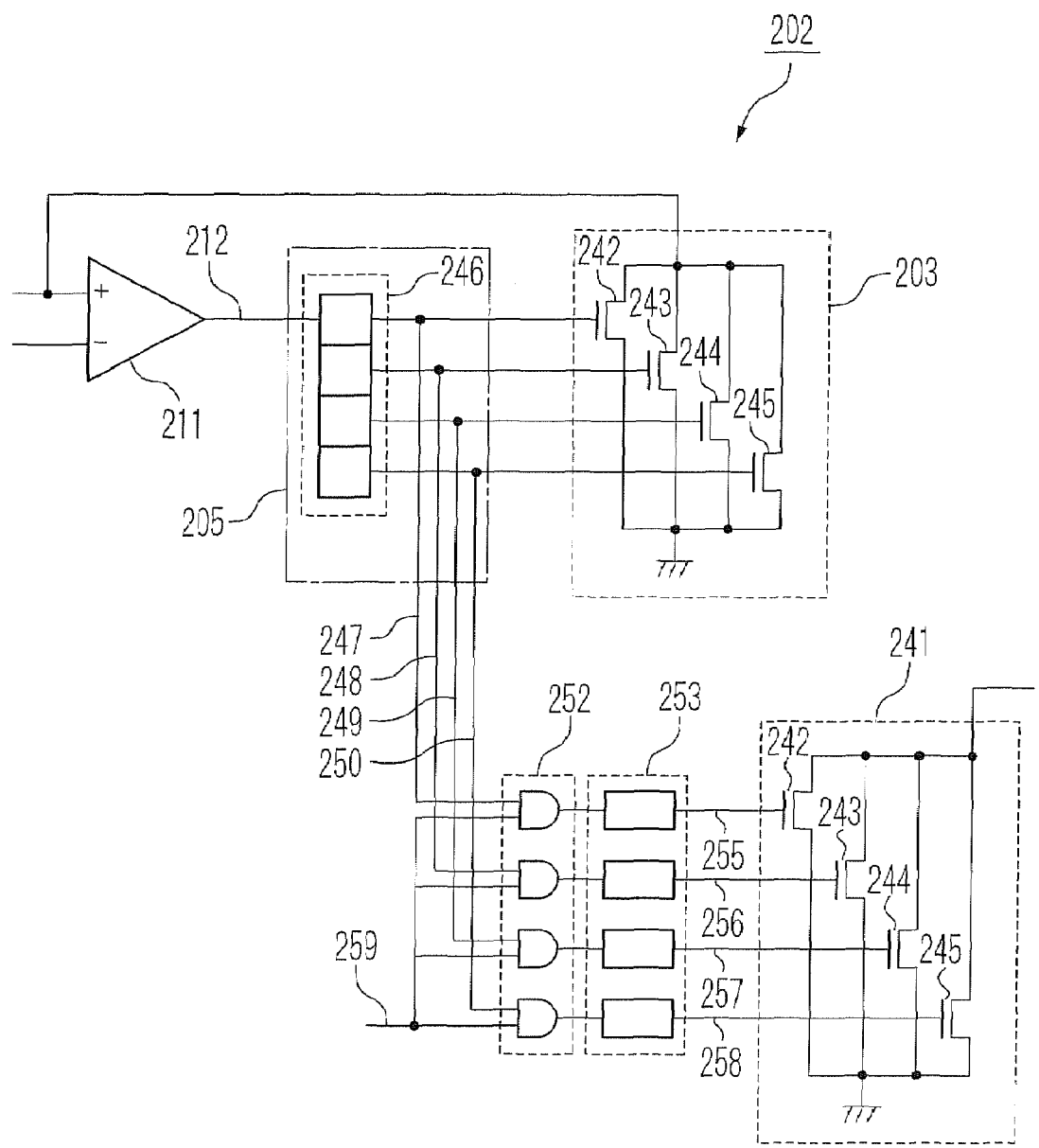
FIG. 3 is a circuit diagram showing the impedance adjusting circuit and a portion of a main buffer as an impedance adjustment target in an LSI shown in FIG. 2.

FIG. 3 is a circuit diagram showing the impedance adjusting circuit and a portion of a main buffer 241 as an impedance adjustment target in the LSI shown in FIG. 2. In the LSI 202, the main buffer 241 is arranged together with the impedance adjusting output buffer 203. The main buffer 241 is connected to one of the case pins of the LSI case 201 shown in FIG. 2. A plurality of MOS (Metal Oxide Semiconductor) transistors 242 to 245 for adjusting the impedances are arranged in the impedance adjusting output buffer 203 and a plurality of MOS (Metal Oxide Semiconductor) transistors 242' to 245' for adjusting the impedances are arranged in the main buffer 241 in the first exemplary embodiment. The comparison result 212 of the comparator 211 is supplied to an adjustment counter 246 in the control circuit 205, which is set to a count value corresponding to an impedance to be set to the impedance adjusting output buffer 203. Outputs 247 to 250 of digits of the adjustment counter 246 at this time are supplied to gates of the MOS transistors 242 to 245, respectively. Then, based on logic states of the outputs 247 to 250, the on/off controls of the MOS transistors 242, to 245' are performed to make the sources and drains of the MOS transistors 242' to 245' conductive or non-conductive. The LSI 202 shown in FIG. 3 contains a selecting circuit 252 for taking the outputs 247 to 250 of the adjustment counter 246 therein at a desirable timing, and a pre-buffer section 253 for storing the outputs of the selecting circuit 252. Outputs 255 to 258 of the pre-buffer section 253 are supplied to the gates of the MOS transistors 242' to 245' in the main buffer 241, respectively. In response to those logic states, the on/off controls of the MOS transistors 242' to 245' are performed, respectively. In this way, the impedance adjusting output buffer 203 is set to a desirable impedance by selectively turning on and off the MOS transistors 242 to 245, and the set result of the impedance adjusting output buffer 203 is reflected to the main buffer 241.

The selecting circuit 252 includes 2-input AND circuits that receive the outputs 247 to 250 of the digits of the adjustment counter 246, respectively. A selection signal 259 is supplied to the other input terminal of each 2-input AND circuit to indicate the timing of the selection. When the selection signal 259 is set to a high level at a predetermined timing, the outputs 247 to 250 of the digits are stored in the corresponding memory regions of the pre-buffer section 253. Then, the MOS transistors 242' to 245' in the main buffer 241 are controlled to be selectively turned on and off. Consequently, the impedance of the main buffer 241 is adjusted to the impedance after the adjustment of the impedance adjusting output buffer 203.

In the first exemplary embodiment as mentioned above, the impedance adjusting circuit 200 measures impedance to be adjusted and adjusts the impedance of the main buffer 241 at the desirable timing based on the measured result. However, the present invention is not limited to this. For example, a circuit portion requiring the impedance adjustment may directly measure the impedance as in the impedance adjusting circuit 200, and change the impedance, in the first exemplary embodiment.

Figure 4:
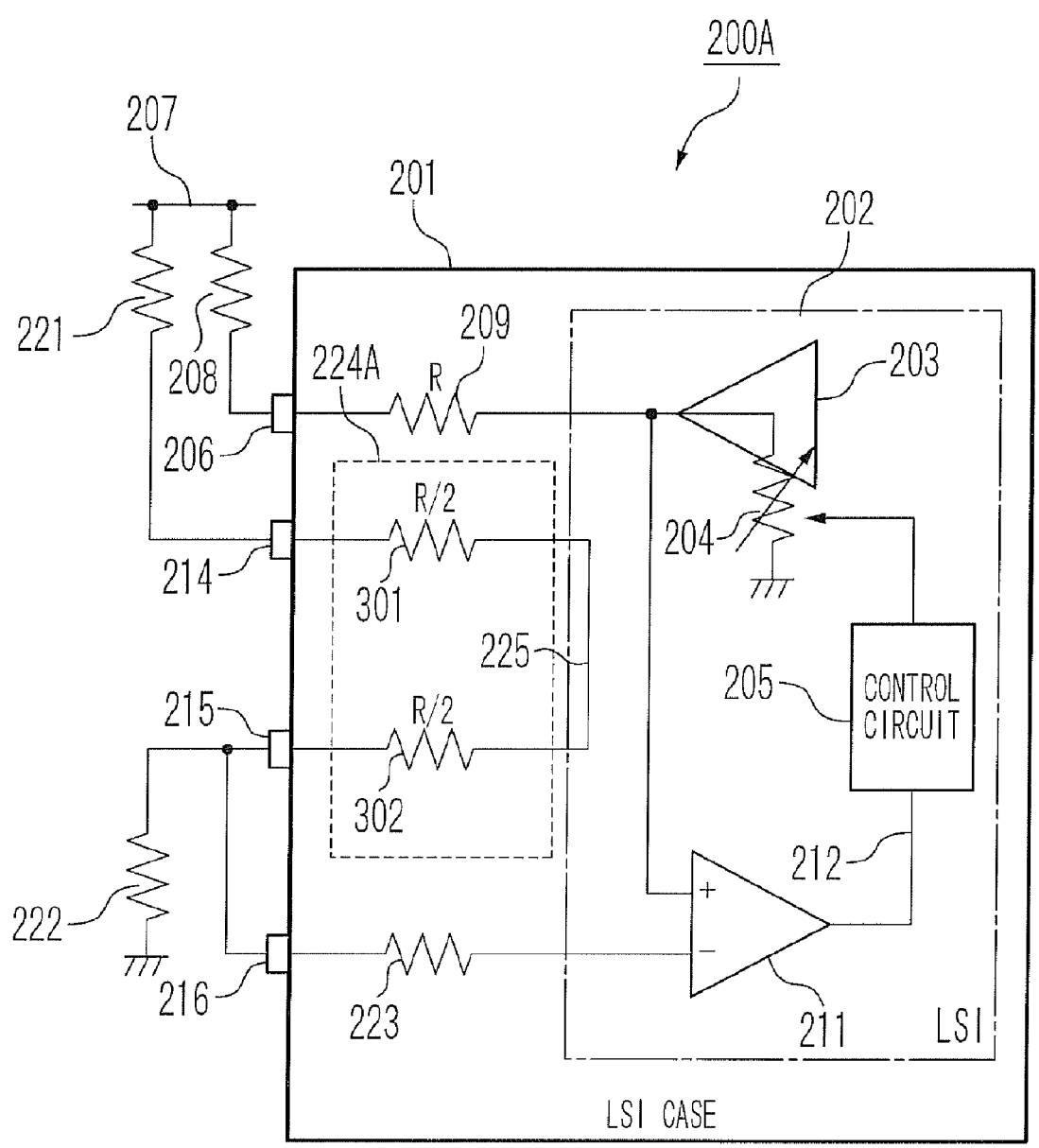
FIG. 4 is a circuit diagram showing the configuration of the impedance adjusting circuit according to a second exemplary embodiment of the present invention.

Next, FIG. 4 is a circuit diagram showing the configuration of the impedance adjusting circuit according to a second exemplary embodiment of the present invention. In FIG. 4, the same symbols are assigned to the same components as those shown in FIG. 2, and the description thereof is properly omitted. In an impedance adjusting circuit 200A of the second exemplary embodiment, a resistance component 301 having a same resistance as a half of the parasitic resistance component 209 is connected between the second case pin 214 and the folded conductive line 225. A resistance component 302 connected between the third case pin 215 and the folded conductive line 225 also has a same resistance as the resistance component 301. The resistance components 301 and 302 of a resistance circuit 224A are parasitic resistance components. Each of the resistance components can be attained by connecting a line, which has a width equal to two times of the width of a line between the first case pin 206 or the fourth case pin 216 and the LSI 202, to the second case pin 214 or the third case pin 215. The width of the line connected to the second case pin 214 or the third case pin 215 is set to be equal to that of the line between the first case pin 206 or the fourth case pin 216 and the LSI 202, but the thickness may be set to be double.

In this way, in the first exemplary embodiment, each of a set of the first and second resistance components 226 and 227 and a set of the third and fourth resistance components 228 and 229 is attained by arranging two lines each having the same width as the line between the first case pin 206 or the fourth case pin 216 and the LSI 202. On the contrary, in the second exemplary embodiment, each line can be attained by means of one line. Thus, a pattern of the line can be simplified. Of course, the adjusting line may be formed of the same material as that of the line between the first case pin 206 or the fourth case pin 216 and the LSI 202. Thus, unlike a case of using the external resistor, the impedance matching of the higher precision can be attained for various situations such as a process, a temperature and a voltage.

Figure 5:
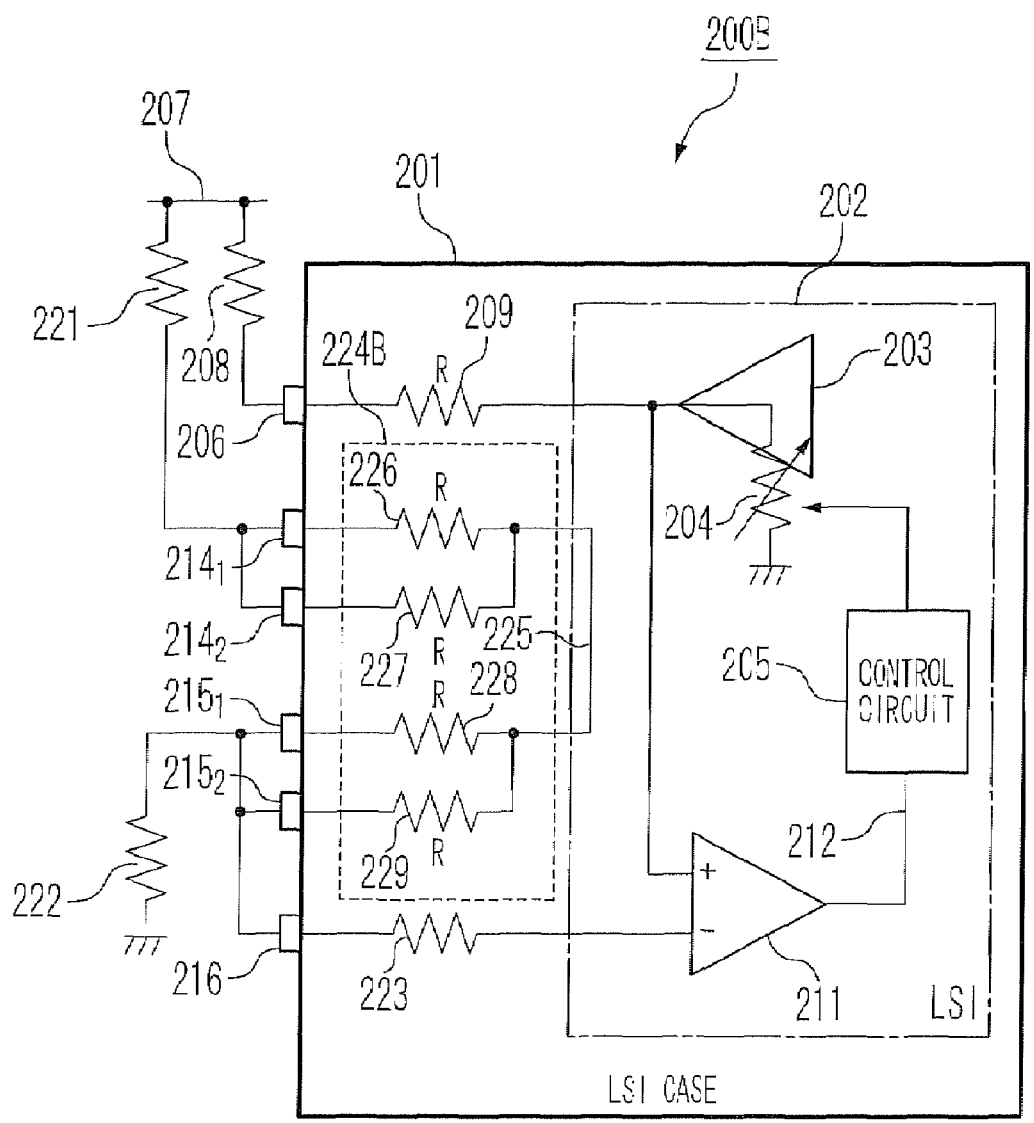
FIG. 5 is a circuit diagram showing a configuration of the impedance adjusting circuit according to a third exemplary embodiment of the present invention.

Next, FIG. 5 is a circuit diagram showing a configuration of the impedance adjusting circuit according to a third exemplary embodiment of the present invention. In FIG. 5, the same symbols are assigned to the same components as those shown in FIG. 2, and the description thereof is properly omitted. In an impedance adjusting circuit 200B in the third exemplary embodiment, the first case pin 206 and the second case pin 216 are not applied with any change. However, instead of the second and third case pins 214 and 215 (FIG. 2) in the first exemplary embodiment, $(1-1)^{-th}$ and $(1-2)^{-th}$ case pins $214_1$ and $214_2$ and $(2-1)^{-th}$ and $(2-2)^{-th}$ case pins $215_1$ and $215_2$ are provided. The $(1-1)^{-th}$ case pin $214_1$ and the $(1-2)^{-th}$ case pin $214_2$ are soldered outside the LSI case 201, and the first reference voltage generation resistor 221 is connected between the power supply line 207 and a connection node between the pins. Also, the $(2-1)^{-th}$ case pin $215_1$ and the $(2-2)^{-th}$ case pin $215_2$ are soldered together with the fourth case pin 216 outside the LSI case 201, and the second reference voltage generation resistor 222 is connected between the ground and a connection node between them.

In the above impedance adjusting circuit 200B, the wiring patterns of the first to fourth resistance components 226 to 229 that are the parasitic resistance components of the resistance circuit 224B are connected to the different case pins, respectively. Thus, the lines that are connected to the $(1-1)^{-th}$ and $(1-2)^{-th}$ case pins $214_1$ and $214_2$ and the $(2-1)^{-th}$ and $(2-2)^{-th}$ case pins $215_1$ and $215_2$ can be reasonably wired in the LSI case 201, as compared with the impedance adjusting circuit 200 in the first exemplary embodiment. Thus, there is a high possibility that the impedance can be excellently adjusted. Of course, by forming the adjusting lines of same material as that of line between the first case pin 206 or the fourth case pin 216 and the LSI 202, the impedance matching in a higher precision can be attained in various situations such as a process, a temperature and a voltage, unlike a case of using an external resistor.

Figure 1:
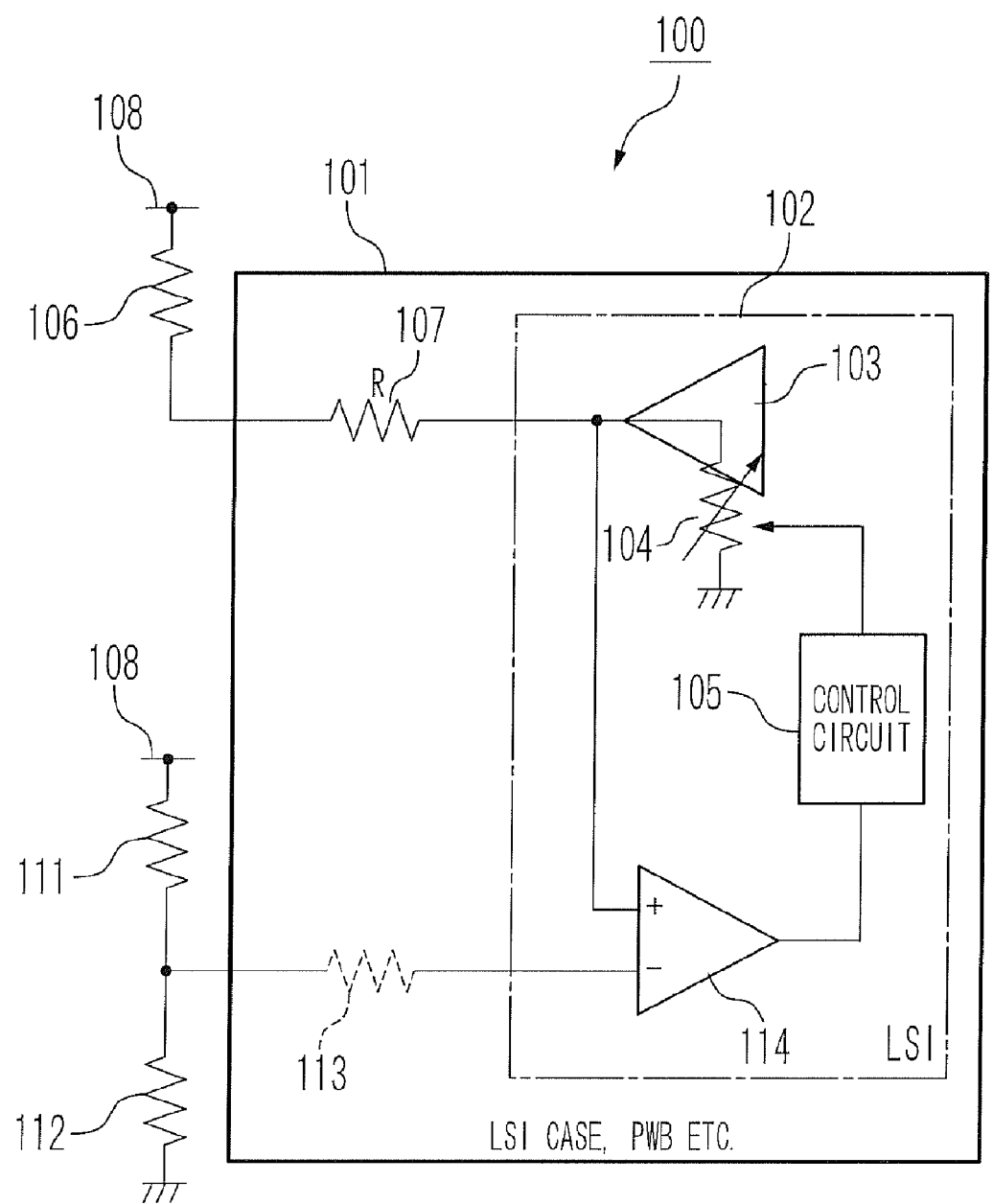
FIG. 1 is a circuit diagram showing a configuration of an impedance adjusting circuit in a related art.
Figure 6:
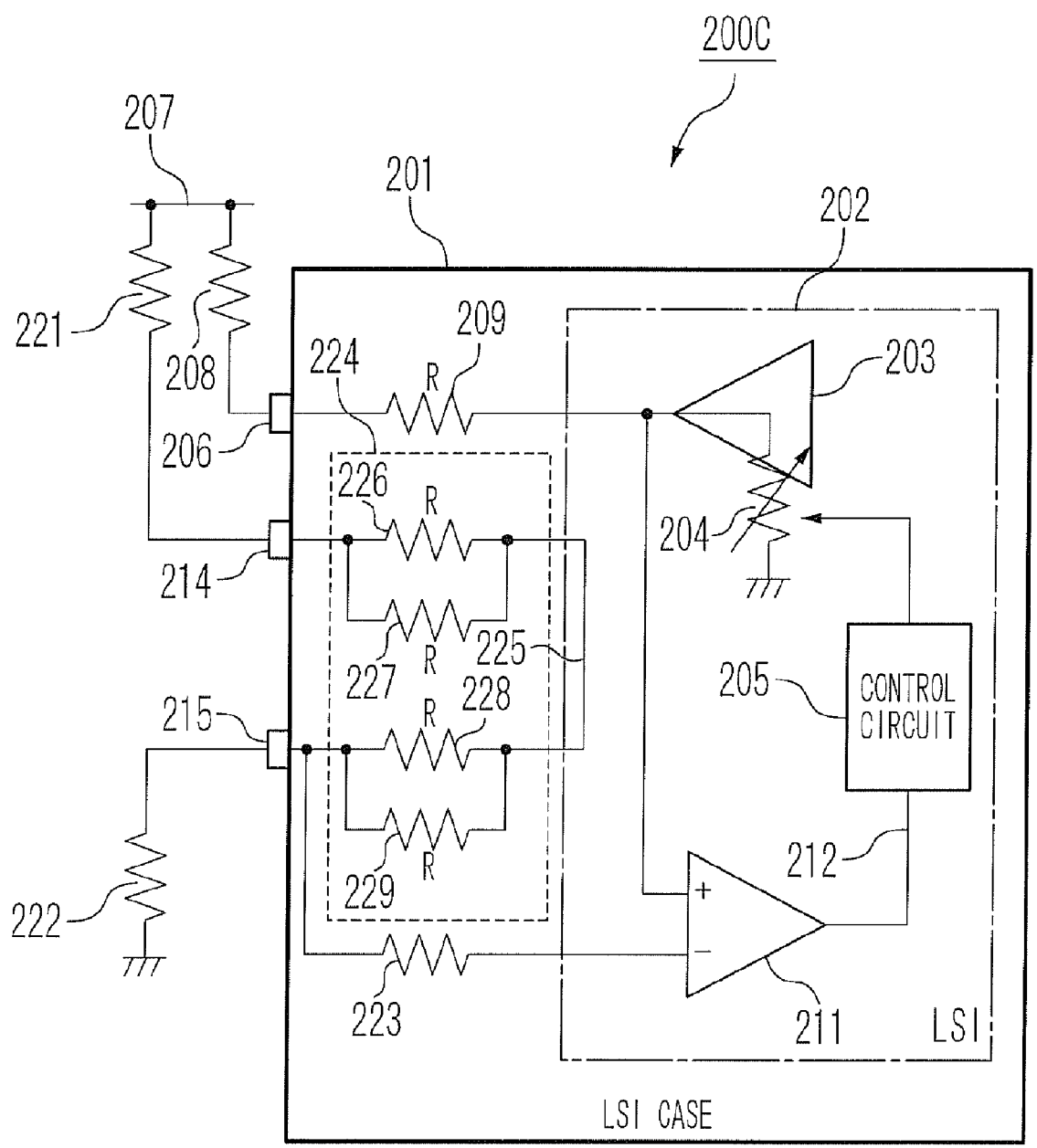
FIG. 6 is a circuit diagram showing the configuration of the impedance adjusting circuit according to a fourth exemplary embodiment of the present invention.

FIG. 6 is a circuit diagram showing the configuration of the impedance adjusting circuit according to a fourth exemplary embodiment of the present invention. In FIG. 6, the same symbols are assigned to the same components as those shown in FIG. 1, and the description thereof is properly omitted. In an impedance adjusting circuit 200C in this fourth exemplary embodiment, only first to third case pins 206, 214 and 215 are used as the case pins of the LSI case 201. Thus, the number of the case pins can be reduced as compared with the first exemplary embodiment shown in FIG. 2. For this reason, a line between the negative input terminal of the comparator 211 is connected to a connection node between the third case pin 215 and the third and fourth resistive components 228 and 229 as the parasitic resistance components in the resistance circuit 224.

In this way, the three routes join inside the LSI case 201 in front of the third case pin 215. Thus, the number of the case pins required in the impedance adjusting circuit 200C can be reduced by one. Of course, the adjusting lines are formed of the same material as that of the line between the first case pin 206 or the third case pin 215 and the LSI 202. Therefore, unlike the case of using the external resistor, the impedance matching in higher precision can be attained for various situations such as a process, a temperature and a voltage.

Figure 7:
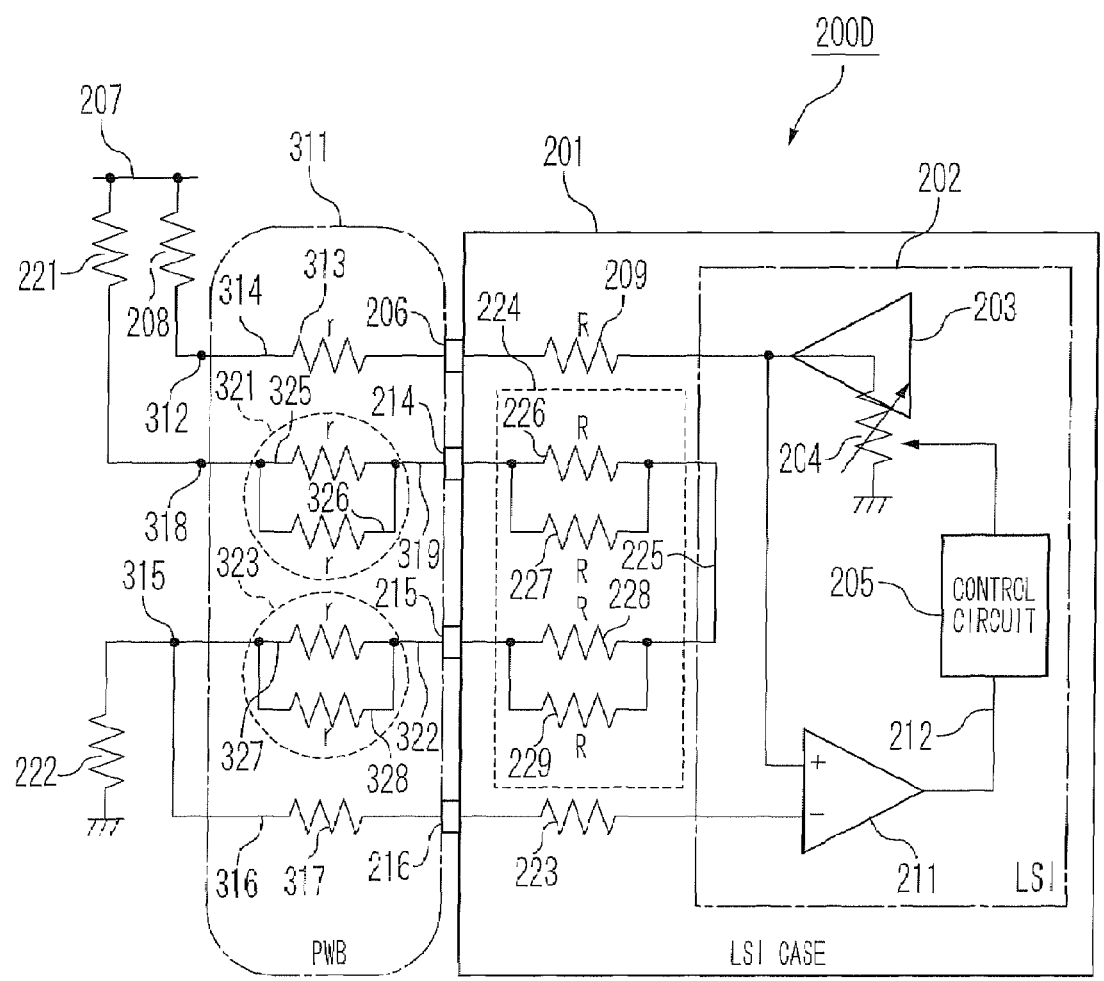
FIG. 7 is a circuit diagram showing the configuration of the impedance adjusting circuit in a fifth exemplary embodiment of the present invention.

Next, FIG. 7 is circuit diagram showing the configuration of the impedance adjusting circuit in a fifth exemplary embodiment of the present invention. In FIG. 7, the same symbols are assigned to the same components as those shown FIG. 1, and description thereof is properly omitted. In an impedance adjusting circuit 200D in the fifth exemplary embodiment, when there is a problem in parasitic resistance components due to a printed wiring board (PWB) 311 from the first to fourth case pins 206 and 214 to 216 on the printed wiring board on which the LSI case 201 is mounted, to the clamp resistor 208 and the first and second reference voltage generation resistors 221 and 222, the compensation for it is designed to be carried out. It is supposed that a parasitic resistance component 314 of a line 313 in the printed wiring board 311 between the first case pin 206 and a node 312 connected to the clamp resistor 208 is defined as a resistance r. The clamp resistor 208 is also connected to the power supply line 207. At this time, in a line 316 in the printed wiring board 311 between the fourth case pin 216 and a node 315 connected to the second reference voltage generation resistor 222, it is supposed that the circuit parameters such as the length and line width are same as those of the line 314. The second reference voltage generation resistor 222 is also connected to the ground. Then, a parasitic resistance component 317 can be also represented by the resistance r. Also, a parasitic resistance component 321 of one line 319 in the printed wiring board 311 between the second case pin 214 and a node 318 connected to the first reference voltage generation resistor 221 is also assumed to be in the same circuit situation as the line 312. The first reference voltage generation resistor 221 is also connected to the power supply line 207. In this case, the resistance of the parasitic resistance component 321 can be regarded as the resistance r. A parasitic resistance component 323 of one line 322 in the printed circuit wiring region 311 between the third case pin 215 and the node 315 can be similarly regarded as the resistance r.

In addition, like the first exemplary embodiment already shown in FIG. 2, it is supposed that the line 319 in the printed wiring board 311 is constituted by two lines 325 and 326 having the same line width as the line 313. Similarly, it is supposed that the line 322 in the printed wiring board 311 is constituted by two lines 327 and 328 having the same line width as the line 313. Thus, the parasitic resistance components of those four lines 325 to 328 can be regarded as the resistance r.

In this way, a synthetic resistance of the two lines 325 and 326 becomes r/2, and a synthetic resistance of the two lines 327 and 328 becomes r/2. Thus, the parasitic resistance component between the node 318 connected to the first reference voltage generation resistor 221 and the node 315 is considered. When this synthetic resistance (parasitic resistance component) is assumed to be $R_{CASE,\ PWD}$, this can be represented by the following equation (6), similarly to the equations (1) to (4).

$$R_{CASE,PWD} = r/2 + R/2 + R/2 + r/2 \qquad (6)$$
$$= r + R$$

That is, in the fifth exemplary embodiment in the present invention, under the situation that the influences of both of the parasitic resistance components of the LSI case 201 and the printed wiring board 311 can be cancelled, the comparator 211 compares a voltage of the clamp resistor 208 on the side of the first case pin 206 and a voltage at the connection node between the first and second reference voltage generation resistors 221 and 222, and outputs the comparison result 212 to the control circuit 205. Thus, any error caused by the parasitic resistance components is never generated in the ideal condition under which the equation (2) is met. Of course, similarly to the above description, one line is laid between the node 318 connected to the first reference voltage generation resistor 221 and the second case pin 214. The width of that line may be set to be two times the line width of the line 313 or line 316. The similar matter is met even in a case that one line is laid between the third case pin 215 and the node 315.

Also, in the fifth exemplary embodiment of the present invention, the adjusting lines in the LSI case 201 and the printed wiring board 311 are formed of the same material as that of the line between the first case pin 206 or the third case pin 215 and the LSI 202. Therefore, unlike the case of using the external resistor, the impedance matching in a higher precision can be attained for various situations such as a process, a temperature and a voltage.

It should be noted that this fifth exemplary embodiment is designed such that the length of the line 313 between the node 312 and the first case pin 206 and the lengths of the lines 316, 319 and 322 are made equal to each other. However, for example, the lengths of the other two lines 316 and 319 may be half the length of the line 313. In this case, the two lines each having the same line width as the line 313 may be used to reduce the resistance of the parasitic resistance components to r/2. Also, in case of the distance relation other than this, naturally, the number of the lines and the line width of the lines may be properly changed to reduce the resistance of the parasitic resistance component to r/2.

Various changes of the line width and the number of the lines as mentioned above can be similarly applied even in the exemplary embodiments and other modifications. That is, the number of the lines constituting the synthetic resistance is not limited to 2, and it may be 3 or more.

As mentioned above, according to the present invention, the parasitic resistance component on the line that has influence on impedance adjustment is cancelled by using a parasitic resistance component on a newly laid line. Thus, since such a line is laid when a circuit apparatus is manufactured, it is possible to easily attain the impedance adjusting circuit and the impedance adjusting method in a higher precision. Moreover, when the materials of the lines are made identical to those of the other circuit portions, the similar characteristics can be given between those portions for various changes in a temperature change or the like. Thus, it is possible to improve the precision of the adjustment and the stability of the characteristics.

While the present invention has been particularly shown and described with reference to the exemplary embodiments thereof, the present invention is not limited to these exemplary embodiments. It will be understood by those of ordinary skill in the art that various changes in form and details may be made therein without departing from the spirit and scope of the present invention as defined by the claims.

What is claimed is:

1. An impedance adjusting circuit comprising:
    a semiconductor device accommodated in a semiconductor device case which has case pins and having a folded conductive line;
    an external reference resistor connected between a positive power supply line and a first one of said case pins, wherein a first line between said first case pin and said semiconductor device has a specific resistance;
    a first reference voltage generation resistor connected between said power supply line and a second one of said case pins;
    a second reference voltage generation resistor connected between the ground and a third one of said case pins;
    a resistance circuit comprising a second line between said second case pin and said folded conductive line and a third line between said third case pin and said folded conductive line, wherein a resistance between said second case pin and said third case pin is equal to the specific resistance; and
    a fourth line connected from said semiconductor device to the ground through said second reference voltage generation resistor and having a resistance equal to the specific resistance,
    wherein said semiconductor device comprises:
    an adjusting circuit having a buffer and configured to adjust an output impedance of said buffer to be adaptive for a predetermined impedance.

2. The impedance adjusting circuit according to claim 1, wherein said predetermined impedance is of a transmission line.

3. The impedance adjusting circuit according to claim 1, wherein said adjusting circuit comprises:
    a buffer with a variable resistor, an output of said buffer is connected to said first line;
    a comparator configured to compare a voltage at an output of said buffer and a voltage at a node between said third case pin and said second reference voltage generation resistor;
    a control circuit configured to adjust said variable resistor based on a comparison result of said comparator.

4. The impedance adjusting circuit according to claim 1, wherein said fourth line is connected to said third case pin.

5. The impedance adjusting circuit according to claim 1, wherein said fourth line is connected to a node between said third case pin and said second reference voltage generation resistor via a fourth one of said case pins.

6. The impedance adjusting circuit according to claim 5, wherein said semiconductor case is mounted on a printed wiring board,
    a fifth line on said printed wiring board between said first case pin and said external reference resistor has a second specific resistance,
    a sixth line on said printed wiring board between said second case pin and said first reference voltage generator resistor has the second specific resistance,
    a seventh line on said printed wiring board between said third case pin and said node has the second specific resistance, and
    an eighth line on said printed wiring board between said fourth case pin and said node has the second specific resistance.

7. The impedance adjusting circuit according to claim 1, wherein said buffer is a replica buffer, and
    said impedance adjusting circuit further comprises another buffer which is controlled in a same manner as said replica buffer.

8. The impedance adjusting circuit according to claim 7, wherein said another buffer is controlled in a same manner as said replica buffer in response to a supplied signal.

9. The impedance adjusting circuit according to claim 1, wherein each of said second and third lines has a half of the specific resistance.

10. The impedance adjusting circuit according to claim 9, wherein each of said second and third lines has two sub lines, each of which has a same width as a width of said first line.

11. The impedance adjusting circuit according to claim 9, wherein each of said second and third lines has one line, which has as a width, two times a width of said first line.

12. The impedance adjusting circuit according to claim 4, wherein each of said second and third lines has one line, which has as a thickness, two times a thickness of said first line.

13. An impedance adjusting method comprising:
providing an impedance adjusting circuit which comprises:
a semiconductor device accommodated in a semiconductor device case which has case pins and having a folded conductive line,
an external reference resistor connected between a positive power supply line and a first one of said case pins, wherein a first line between said first case pin and said semiconductor device has a specific resistance,
a first reference voltage generation resistor connected between said power supply line and a second one of said case pins,
a second reference voltage generation resistor connected between the ground and a third one of said case pins,
a resistance circuit comprising a second line between said second case pin and said folded conductive line and a third line between said third case pin and said folded conductive line, wherein a resistance between said second case pin and said third case pin is equal to the specific resistance, and
a fourth line connected from said semiconductor device to the ground through said second reference voltage generation resistor and having a resistance equal to the specific resistance; and
adjusting an output impedance of a buffer to be adaptive for a predetermined impedance.

14. The impedance adjusting method according to claim 13, wherein said adjusting comprises:
comparing a voltage at an output of said buffer and a voltage at a node between said third case pin and said second reference voltage generation resistor; and
adjust a variable resistor of said buffer based on the comparison result.

15. The impedance adjusting method according to claim 14, wherein said buffer is a replica buffer, and
controlling another buffer in a same manner as said replica buffer.

16. The impedance adjusting method according to claim 15, wherein said controlling another buffer comprises:
controlling said another buffer in a same manner as said replica buffer in response to a supplied signal.

* * * * *